United States Patent [19]

Ito et al.

[11] 4,274,053

[45] Jun. 16, 1981

[54] MAGNETIC ROTARY ENCODER FOR DETECTION OF ABSOLUTE VALUES OF ANGULAR DISPLACEMENT

[75] Inventors: Susumu Ito; Kaoru Toki, both of Tokyo, Japan

[73] Assignee: Nippon Electric Co., Ltd., Tokyo, Japan

[21] Appl. No.: 17,770

[22] Filed: Mar. 5, 1979

[30] Foreign Application Priority Data

Mar. 6, 1978 [JP] Japan .................................. 53-25818

[51] Int. Cl.³ ........................... G01P 3/48; G01P 3/54
[52] U.S. Cl. ................................ 324/174; 324/151 R; 324/208; 340/347 P
[58] Field of Search ............... 324/173, 174, 208, 151, 324/152; 340/347 P, 347 R

[56] References Cited

U.S. PATENT DOCUMENTS

| | | | |
|---|---|---|---|
| 3,197,763 | 7/1965 | Fisher | 324/173 |
| 3,293,636 | 12/1966 | Dunne | 340/347 P |
| 3,613,000 | 10/1971 | Weir et al. | 324/208 |
| 3,993,946 | 11/1976 | Makino | 324/208 |
| 4,039,936 | 8/1977 | Janes et al. | 324/308 |

OTHER PUBLICATIONS

A. B. Wills, *Technical Disclosure Bulletin,* vol. 16, No. 1 (Jun. 1973), p. 260.
"The Barber Pole, A Linear Magnetoresistive Head," by K. E. Kuijk et al., published in IEEE Transaction on Magnetics, vol. Mag.-11, No. 5, (Sep. 1975), pp. 1215-1217.

*Primary Examiner*—Alfred E. Smith
*Assistant Examiner*—Thomas P. O'Hare
*Attorney, Agent, or Firm*—Sughrue, Rothwell, Mion, Zinn and Macpeak

[57] ABSTRACT

A magnetic rotary encoder for detecting the absolute value of an angular displacement using magneto-resistors is disclosed. A drum, disk or cup-shaped rotary member is attachable to a rotatable shaft. A magnetic medium divided into a plurality of tracks is provided on a surface of the rotary member. Each of the tracks produces magnetic fields changing in magnitude and direction as the rotary member revolves. Alternatively, a plurality of permanent magnets are provided on the surface of the rotary member to produce the alternating magnetic field as the rotary member revolves. A plurality of magneto-resistors are provided in the vicinity of the rotating paths of the tracks and produce analog signals indicative of changes in their electrical resistances. A rotary condition detector receives the analog signals and produces digital signals and/or an analog signal indicative of the angular distance moved by the rotatable shaft in an absolute value.

26 Claims, 28 Drawing Figures

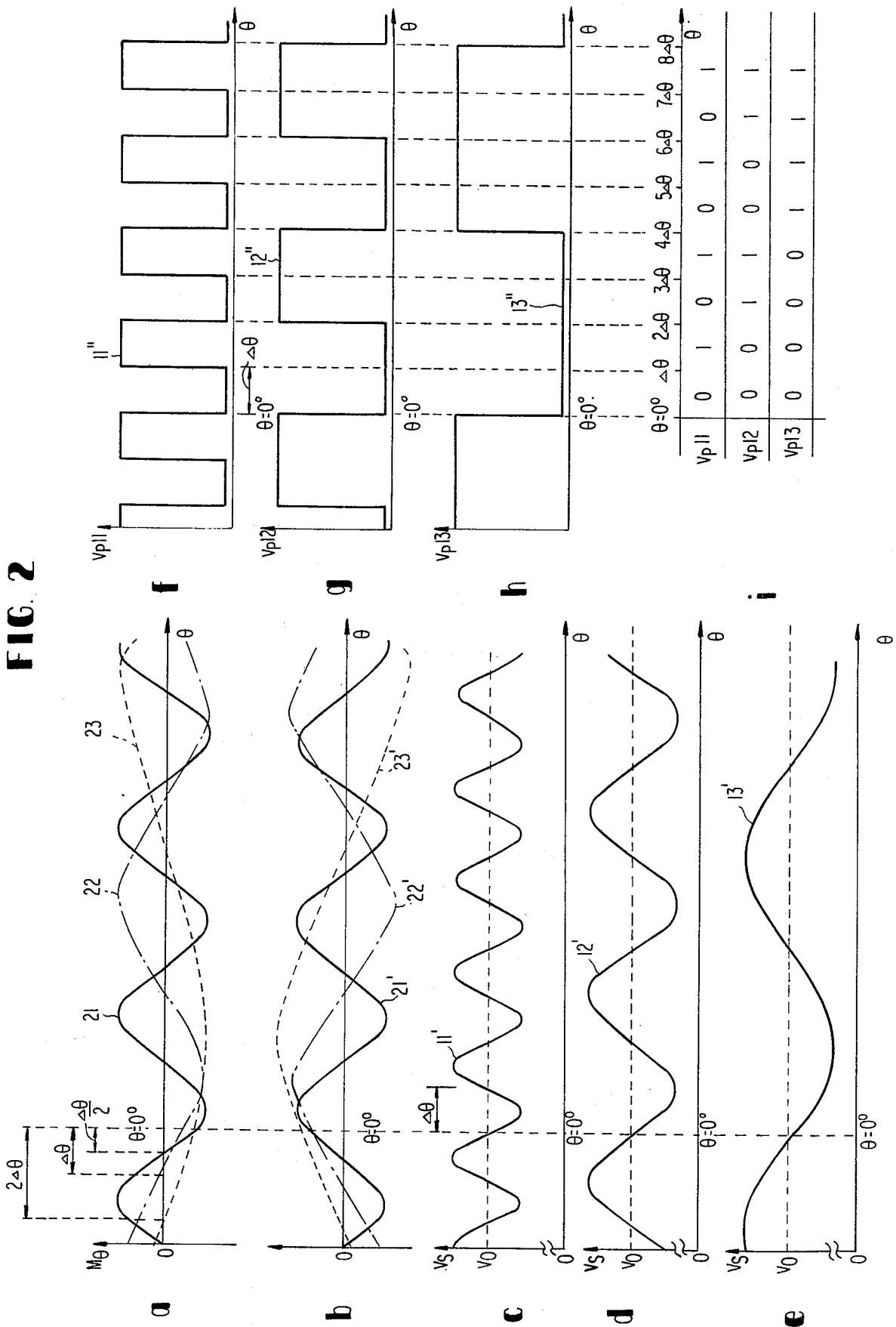

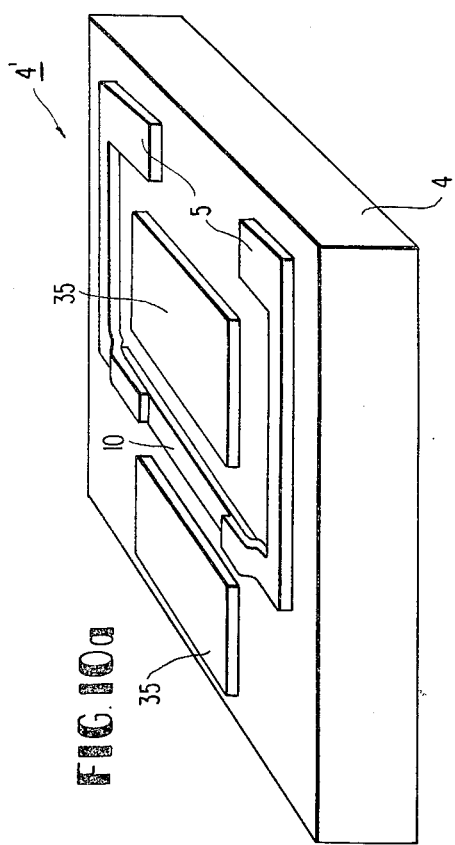
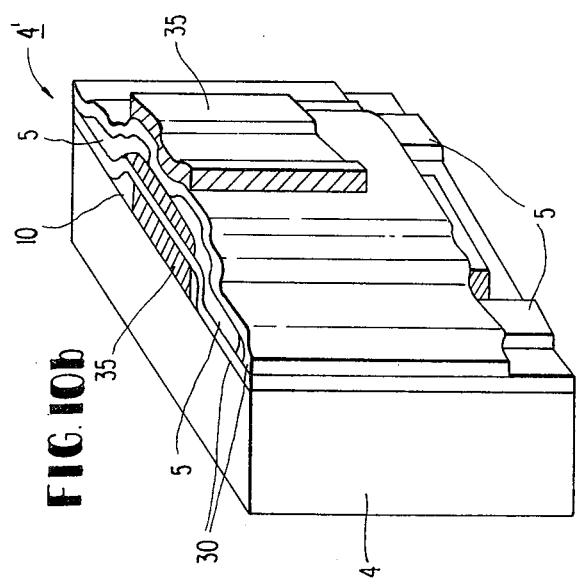
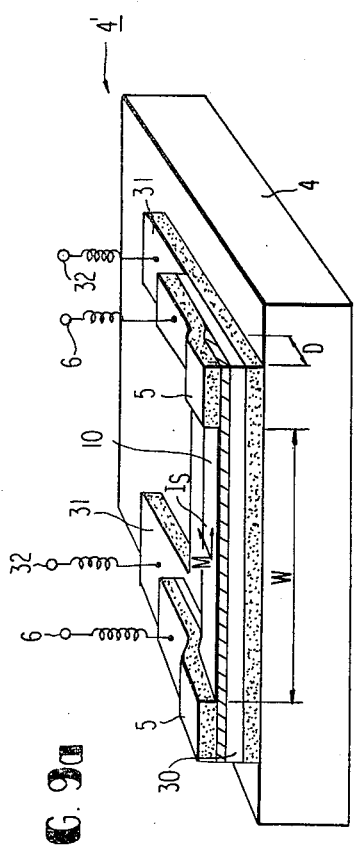
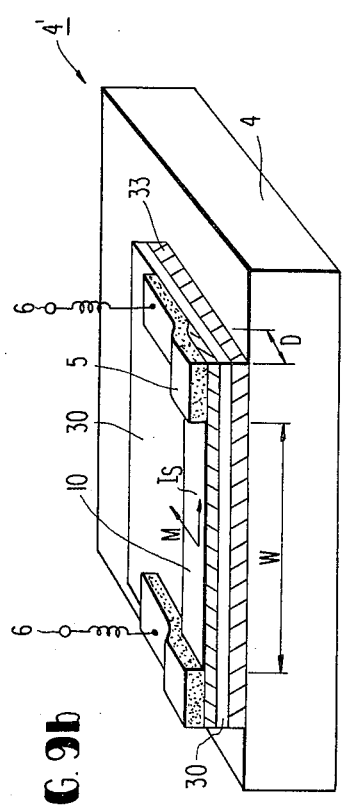
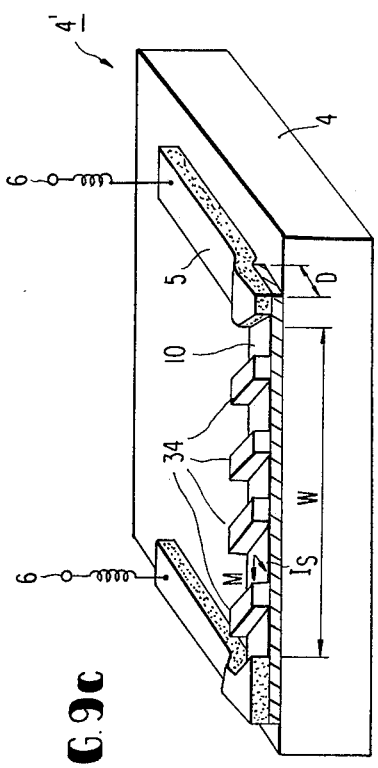

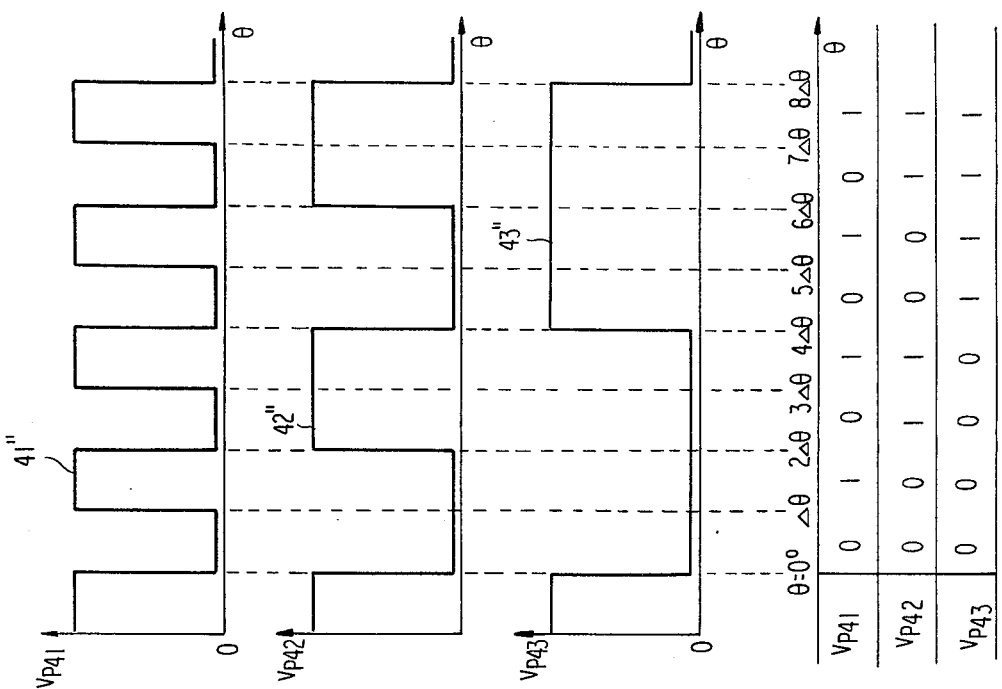
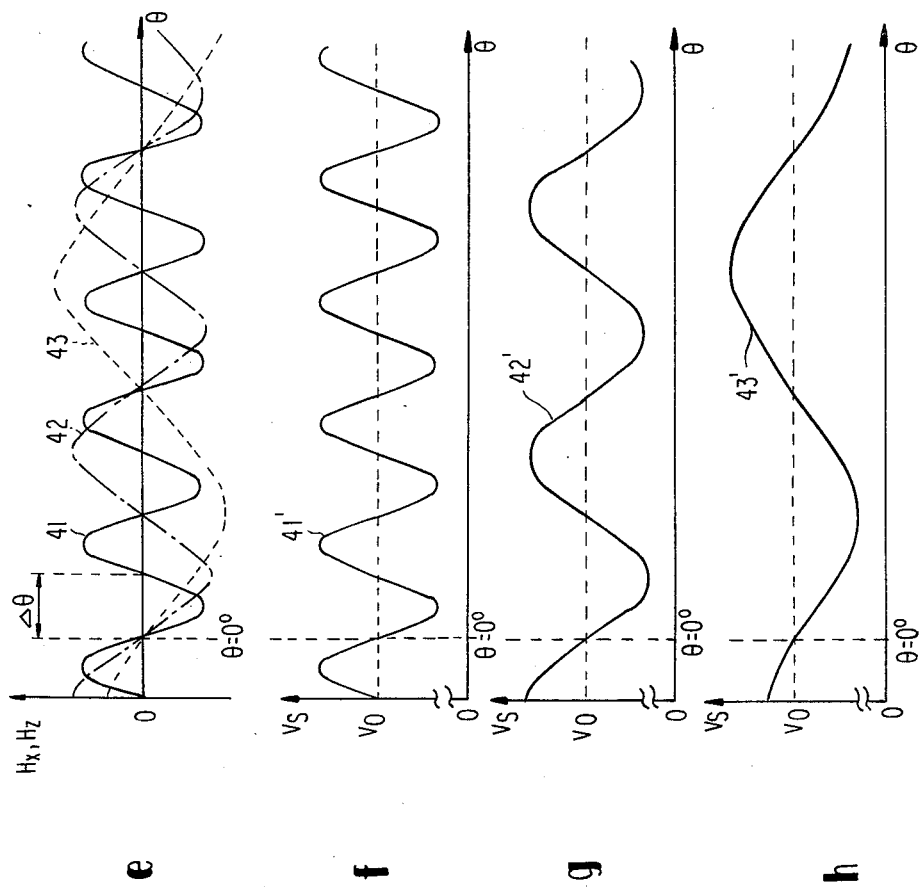
FIG. 11

FIG.13c
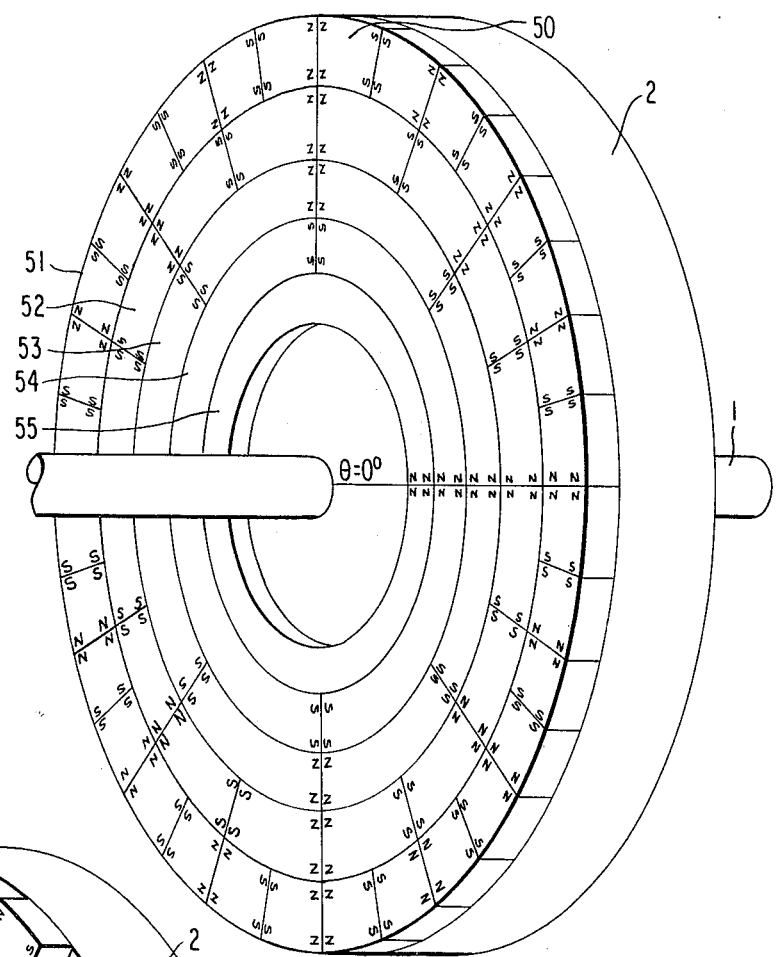
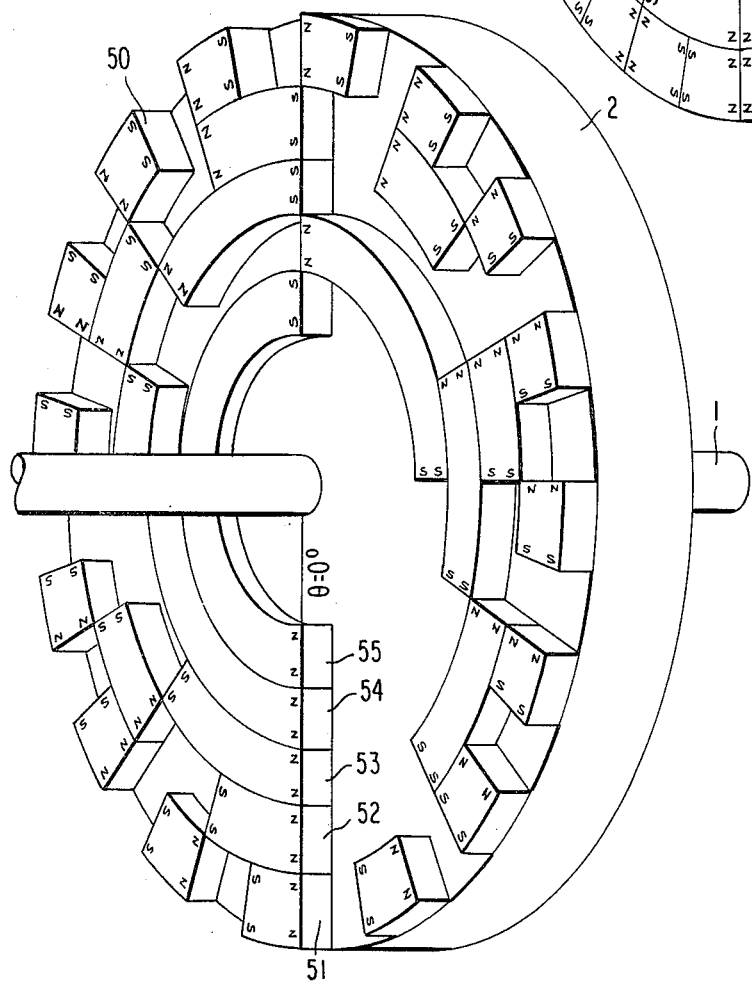
FIG.13d

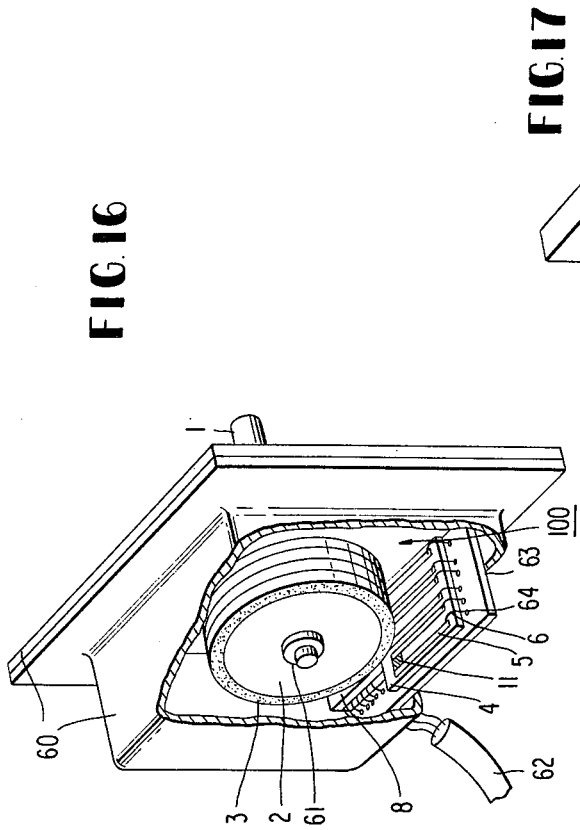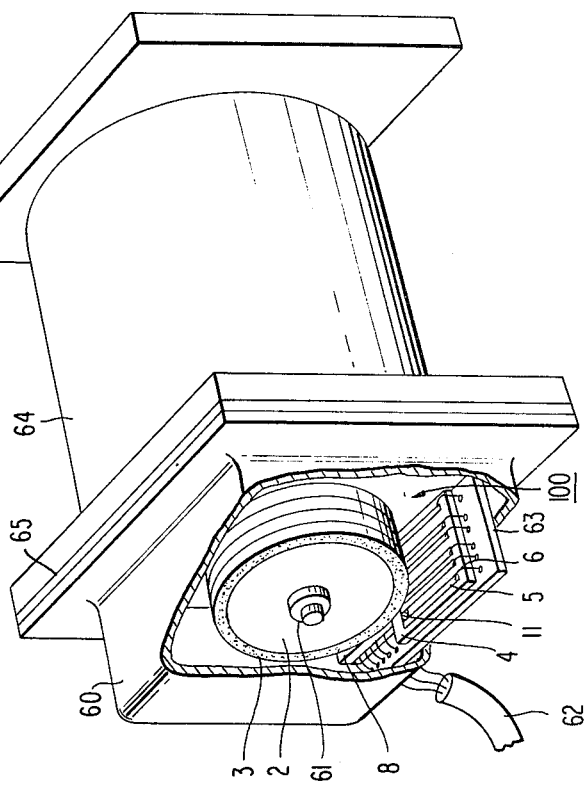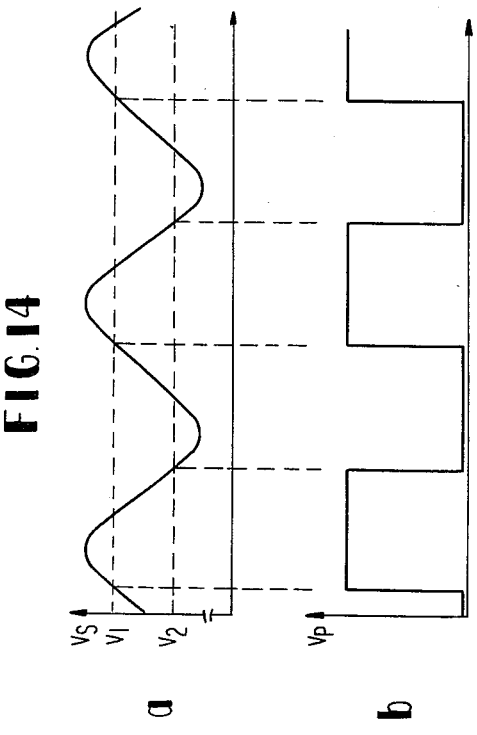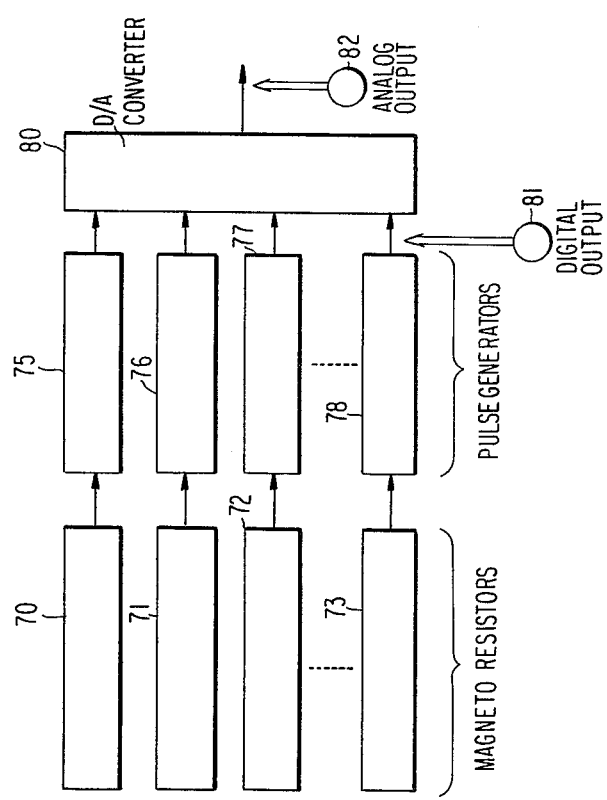

4,274,053

MAGNETIC ROTARY ENCODER FOR DETECTION OF ABSOLUTE VALUES OF ANGULAR DISPLACEMENT

FIELD OF THE INVENTION

This invention relates to a magnetic rotary encoder or a magnetic tachometer for detecting in absolute value the rotated angular distance as well as angular velocity of a rotatable shaft.

BACKGROUND OF THE INVENTION

It is often required in many industrial fields to accurately and reliably measure the angular distance moved as well as instantaneous angular velocity of a rotatable shaft attached to, for example, a motor or a gear. Especially, these requirements are found in a precision-machine-related field, so that high accuracy as well as high reliability are indispensable. As the most desirable measuring devices to meet such requirements, several proposals based on digital control have been made heretofore.

One example of conventional products of this kind is the optical rotary encoder comprising, a glass disk with a plurality of photoslits, one or more LEDs (light emitting diodes), and one or more photo-sensitive diodes. The photo-slits are usually provided on the glass disk by the following steps: firstly, a suitable metal film is plated on the disk by vapor deposition techniques, secondly photo-resist film is coated on the metal film and is selectively exposed to light and then developed, and finally the areas not exposed are chemically etched. The LED and the photo-diode are positioned at the opposite sides of the glass disk for detecting the rotating conditions of the disk.

However, this optical encoder involves some difficulties: (1) it requires a highly accurate exposure as well as highly skilled etching techniques to provide the photo-slits on the entire surface of the disk without aberration, (2) it is practically very difficult to accurately adjust the center of the photo-slits with that of a rotatable shaft receiving bore, (3) in order to tightly receive the rotatable shaft, such a bore should be precisely processed and finished, (4) as a consequence the encoder costs too much for achieving initially intended results, and (5) furthermore, the encoder is vulnerable to external shocks.

Meanwhile, a magnetic tachometer was proposed in *IBM Technical Disclosure Bulletin*, Volume 16, No. 1, (June 1, 1973) page 260. The tachometer comprises a disk carrying a magnetic medium on one surface near its perimeter, and a magnetic flux transducer. The transducer senses magnetic signals recorded on the magnetic medium to determine the rotational speed of the disk and, therefore the rotational speed of the shaft to which the disk is connected. However, the above-mentioned article merely suggests the possibility of its realization, without giving a detailed description.

Another example of a conventional magnetic rotary encoder is disclosed in the U.S. Pat. No. 4,039,936. This encoder comprises a plurality of thin plate-like permanent magnets, a rotatable drum having a shaft, and a magnetic field sensing transducer. The permanent magnets are provided on the outer perimeter of the drum with every two adjacent ones given opposite directions of magnetization. The magnetic field sensing transducer is fixedly positioned near the rotating paths of the magnets. It is acknowledged that this prior art has some advantage: it withstands external shocks; and the drum can be precisely manufactured in dimensions so that it is free from undersirable mechanical vibrations. It is, however, unsuitable for directly measuring absolute values of angular displacement through which the shaft turns.

An object of the present invention is therefore to provide an improved magnetic rotary encoder for precisely and reliably measuring in abosolute value the rotated angular distance as well as angular velocity of a rotatable shaft.

Another object of this invention is to provide an improved magnetic rotary encoder, which can be precisely manufactured, accurately installed, and has a high shock-resistant property.

SUMMARY OF THE INVENTION

According to this invention, a magnetic rotary encoder comprises: first means fixedly attachable to a rotatable shaft; a plurality of second means each retaining a magnetic signal, said means being provided on said first means so as to form more than two tracks substantially parallel to the circumference of said first means, said tracks producing respectively magnetic fields changing in magnitude and direction as said first means revolves; a plurality of ferro-magneto-resistors fixedly provided in the vicinity of the rotating paths of said tracks and producing analog signals indicative of changes in their electric resistances; and a rotary condition detector electrically connected to said magneto-resistors, receiving said analog signals and producing digital signal and/or an analog signal indicative of the angular distance moved by said first means in an absolute value.

BRIEF DESCRIPTION OF THE DRAWINGS

These and other objects, features and many of the attendant advantages of this invention will be appreciated more readily as the same becomes better understood by reference to the following detailed description, when considered in connection with the accompanying drawings, wherein like parts in each of the several figures are identified by the same reference numerals, and wherein:

FIGS. 2(*a*) through 2(*h*) show waveforms for use in discussing the functions of the first embodiment of FIG. 1;

FIG. 2(*i*) is a table showing address information indicating the angular distance moved by the rotary means comprised in the first embodiment;

FIG. 6(*i*) is a table showing address information indicating the angular distance moved by the rotary means in the third or fourth embodiment;

FIG. 8(*i*) is a table showing address information indicating the angular distance moved by the rotary means in the fifth embodiment;

FIGS. 9a through 9c are each a schematic perspective view of a magnetic field detector installing conventional biasing means applicable to this invention;

FIGS. 10a and 10b are each a schematic perspective view of a magnetic field detector installing high resolution means for use in this invention.

FIGS. 11b, 11(d) through 11(k) show waveforms for use in discussing the embodiments of FIGS. 11a and 11c;

FIG. 11(l) is a table showing address information indicating the angular distance moved by the rotary means in the embodiment of FIG. 11a or 11c;

FIGS. 13b through 13d each is a schematic perspective view of a modified eighth embodiment;

FIGS. 14(a) and 14(b) show waveforms for describing a pulse generating method used in this invention;

FIG. 15 is a block diagram of a rotary condition detector used in this invention;

FIG. 16 is a schematic perspective view, partially broken away, of the magnetic rotary encoder embodying this invention and encased in a housing; and FIG. 17 is a perspective view illustrating one application of this invention to a motor.

DETAILED DESCRIPTION OF PREFERRED EMBODIMENTS OF THIS INVENTION

Figure 1:
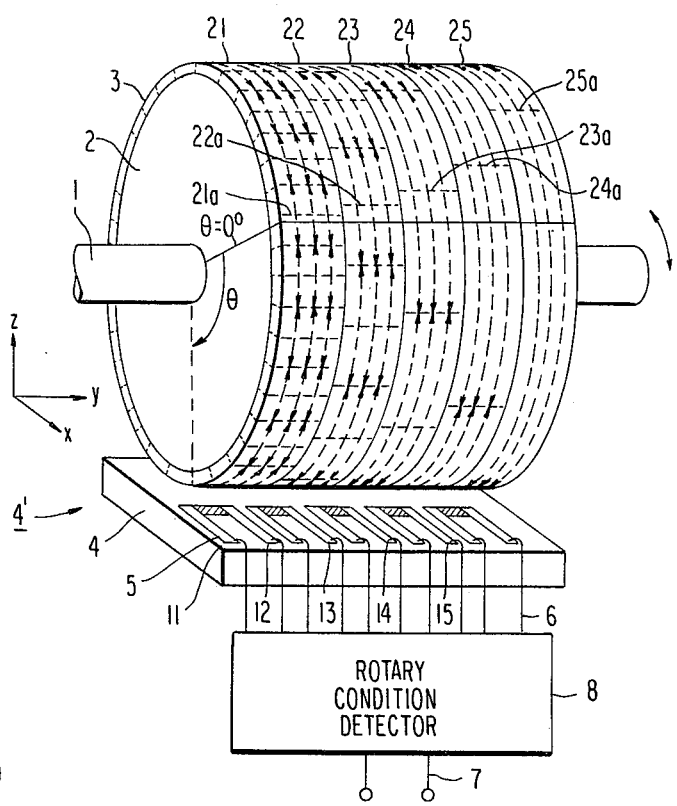
FIG. 1 is a schematic perspective view of a first preferred embodiment of this invention.

Referring now to FIG. 1, wherein a first embodiment of this invention is schematically illustrated in perspective, a drum type rotary means 2 carries fixedly at its center axis a rotatable shaft 1 which is connectable to an axle extending from a rotating device or member such as a motor or a gear not shown. A magnetic medium 3 is provided on the substantially entire periphery of the drum 2, and magnetically divided into five tracks 21 to 25 in a circumferential direction. Each of the five tracks 21 to 25 is divided into magnetic sections in a longitudinal direction of the drum 2. Each magnetic section of these tracks is oppositely magnetized with respect to its adjacent ones as shown by broken lines having arrow heads. A magnetic field detector 4' is provided in the vicinity of the rotating path of the medium 3 and in this instance fixed below the drum 3. The magnetic field detector 4' comprises a supporting base 4, five ferromagnetic magneto-resistors 11 to 15 (hereinafter generally referred to as MRs), ten conductive strips 5 coupled to corresponding ones of the MRs, and leads 6 for connections of the detector 4' to an external circuit, viz., a rotary condition detector 8. Each boundary dividing the adjacent magnetic sections of the each of the tracks 21–25 is disposed parallel to the longitudinal line of the magneto-resistors 11–15, as illustrated in FIGS. 1, 3, 4, 5 and 8, or are disposed within an angle of ±45° therefrom as illustrated in FIG. 9c. The detector 8 has output terminals 7. The MRs are responsive to the changing leakage magnetic flux from the track.

The functions of the first embodiment will be discussed by reference to FIGS. 2(a) to 2(i), wherein it is assumed that only three MRs 11 to 13 are provided. However, it is not difficult to extend the discussion to the other MRs 14 and 15. Each of the MRs 11 to 13 changes its electrical resistance in response to the applied magnetic field as a function of an angle $\phi$ which is defined by the directions of the magnetization M and a sense current Is flowing through the MRs. More specifically, the resistance change of the MR is quantitatively expressed:

$$R = R_0 - \Delta R \sin^2 \phi$$

where $R_0$ = the resistance of the MR where the magnetization M is parallel to the sense current Is; and $\Delta R$ = a constant resistance value of the MR.

Magnetic signals recorded on the sections of the tracks 21 to 23 change as a function of angular distance $\theta$ of the shaft 1 as shown in FIG. 2(a). On the other hand, magnetic field intensities H$\theta$ (21', 22', and 23') resulting from the tracks 21, 22, and 23 change as a function of the angular distance $\theta$, as shown in FIG. 2(b). H$\theta$ affects the magnetization M of the MR so as to make it perpendicular to the sense current Is, thus the MRs 11, 12, and 13 produce voltage signals 11', 12', and 13' changing as a function of $\theta$, which are shown in FIGS. 2(c), 2(d), and 2(e), respectively. These voltage signals 11' to 13' are then converted into corresponding pulse trains 11" to 13", with reference to a threshold V$\theta$ set at about their center values, which are shown in FIGS. 2(f), 2(g), and 2(h), respectively. Assuming that the upper and lower levels of the pulses are logic "1" and "0", respectively, then three sequences of bits are obtained as shown in the table of FIG. 2(i). The table shows that the angular distance corresponding to one period of the pulse train 13" is differently addressed for every $\Delta\theta$ (minimum angular determining unit). It is therefore understood that if the full 360° is differently addressed, the angular distance through which the shaft 1 turns can be accurately detected by knowing the address. It should be noted that the unit $\Delta\theta$ corresponds to half the shortest magnetic section (i.e., bit-length) of the tracks. In other words, the shortest bit-length can be expressed by $2\Delta\theta$. We are now able to actually determine the unit $\Delta\theta$ by knowing the number of the tracks: if this number is m, then $2^m$ addressed are obtained so that the full 360° can be addressed by $2^m$, and hence $\Delta\theta = 360°/2^m$. In this embodiment, as m=5, 66 $\theta = 360°/2^5 = 11.25+$. On the other hand, the bit-length of the tracks 21 to 23 can be determined as follows:

$$P_{21} = 2\Delta\theta = 2(2\pi\gamma_{21}/2^m) = 2\pi\gamma_{21}/2^{m-1}$$

$$P_{22} = 2 \cdot 2\Delta\theta = 2\pi\gamma_{22}/2^{m-2}$$

$$P_{23} = 4 \cdot 2\Delta\theta = 2\pi\gamma_{23}/2^{m-3}$$

where $P_{21}$, $P_{22}$, and $P_{23}$ are the bit-lengths of the tracks 21, 22, and 23, respectively; $r_{21}$, $r_{22}$, and $r_{23}$ are inner radii of the tracks 21, 22, and 23, but, in this case, $r_{21} = r_{22} = r_{23}$; and m=5.

Each of the boundaries dividing the magnetic sections is indicated by broken lines in FIG. 1, corresponding to zero-crossing points in FIG. 2(a). Reference characters 21a to 25a of FIG. 1 depict the nearest boundaries from the reference line ($\theta = 0$). It is of importance to note that these boundaries 21a to 25a are respectively deviated from the reference line ($\theta = 0$) by $\Delta\theta/2$, $\Delta\theta$, $2\Delta\theta$, $4\Delta\theta$, and $8\Delta\theta$ (namely, in a manner of $(\Delta\theta/2)2^{m-1}$, where m=1, 2, ..., 5). Thus, if the signals 11', 12' and 13' are converted with reference to V$_0$, into the pulse trains 11"12", and 13", respectively, then their phases coincide at $\theta=0$.

Figure 3:
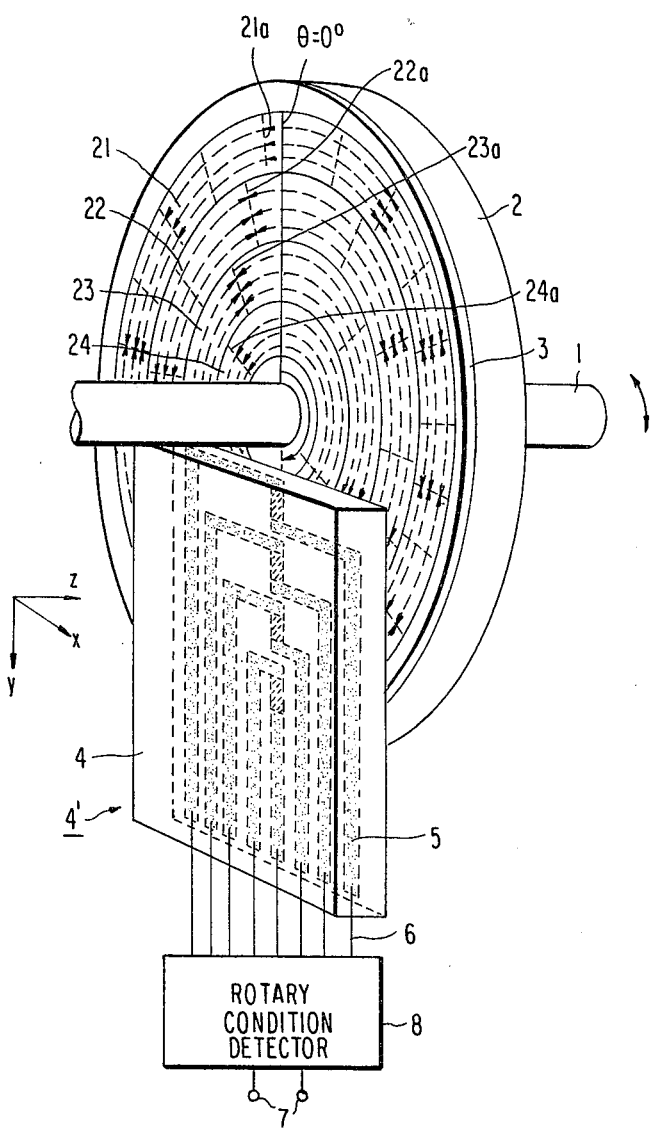
FIGS. 3, 4, and 5 are schematic perspective views of second, third, and fourth preferred embodiments of this invention, respectively.

FIG. 3 schematically illustrates in perspective a second embodiment of this invention. In this embodiment, the drum 2 of FIG. 1 is replaced by disk type rotary means labelled with a like reference numeral. To meet this modification, the magnetic medium 3 is provided on one side surface of the disk 2, and the magnetic field detector 4' being changed in position such that the MRs face the medium 3. The arrangement of FIG. 3 functions just as the first embodiment of FIG. 1, so detailed description will be omitted.

Figure 4:
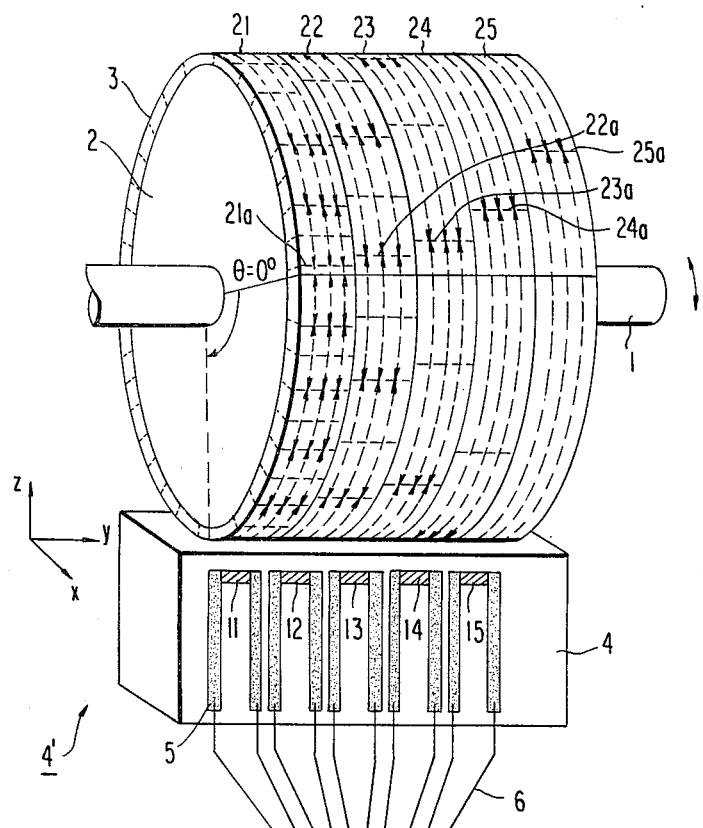
Figure 5:
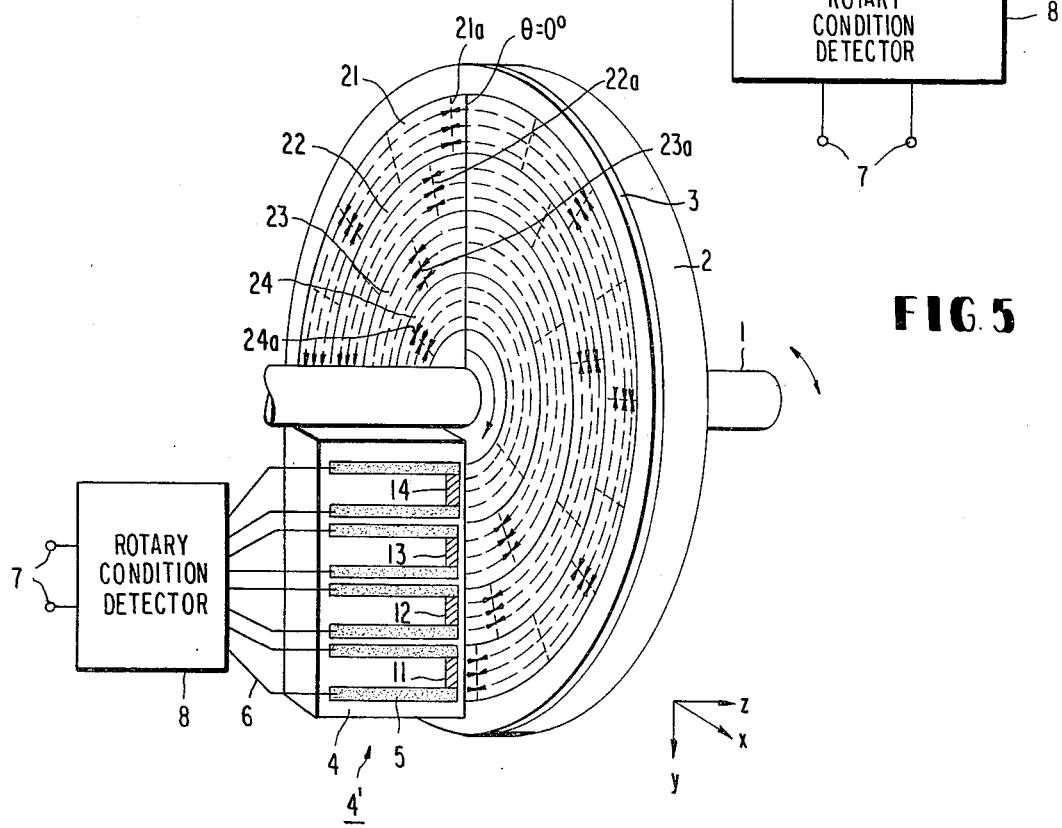
Figure 6:
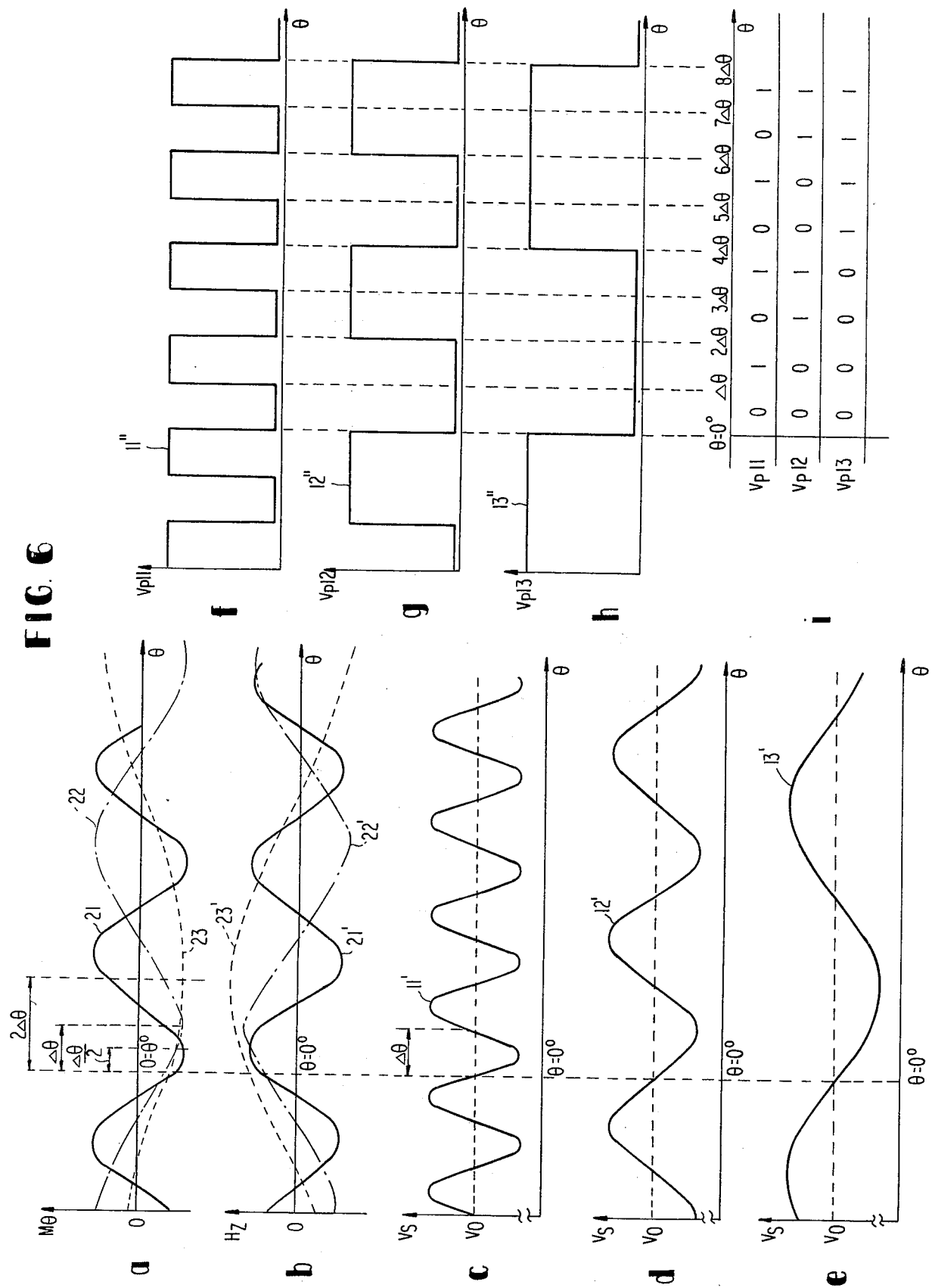
FIGS. 6(*a*) through 6(*h*) show waveforms for use in discussing the functions of the third and fourth embodiments.

Referring to FIGS. 4 and 5, there are schematically illustrated third and fourth embodiments of this invention which are modifications of the first and second embodiments, respectively. For convenience, an angle between the surfaces of the MRs and the medium 3 will be denoted $\phi$. The first and second embodiments are modified such that the angle $\phi$ changes from about 0° to about 90° (degrees). According to these modifications, the MRs are responsive to the magnetic field in a direction of the z-axis, and the signals derived from the MRs are deviated in the same direction by half the corresponding bit-length as shown in FIGS. 6(b).

FIGS. 6(a) to 6(i) correspond to FIGS. 2(a) to 2(i), respectively, and the functions of these modifications are substantially identical to those of the first and second embodiments, so further description will be omitted for clarity. Although the angle $\phi$ is arbitrary, it is preferred to take a value of 0° or 90° to avoid undesirable superimposition of the resultant waveforms.

Figure 7:
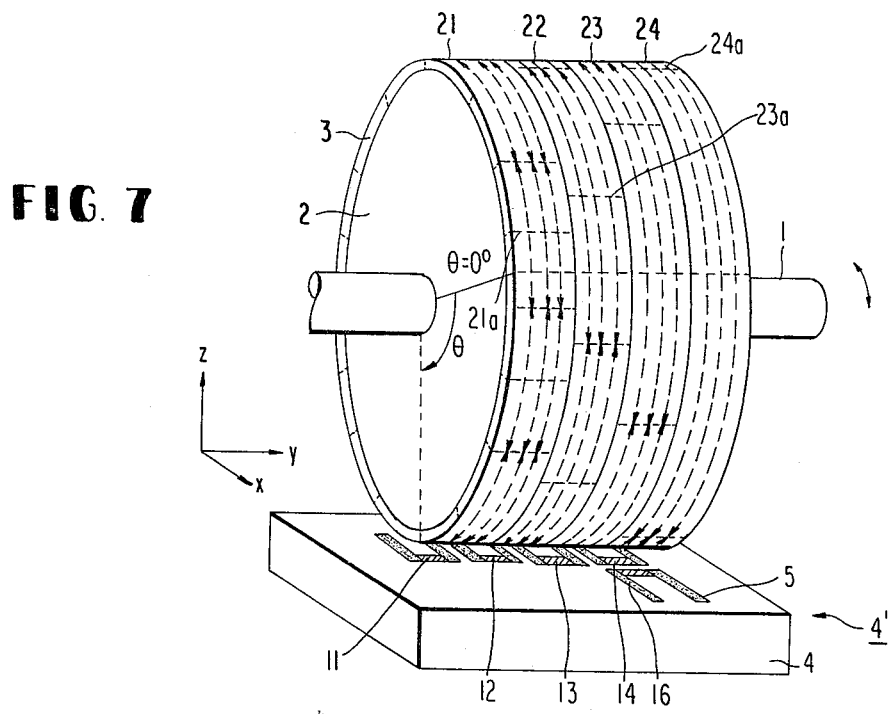
FIG. 7 is a schematic perspective view of a fifth embodiment of this invention.
Figure 8:
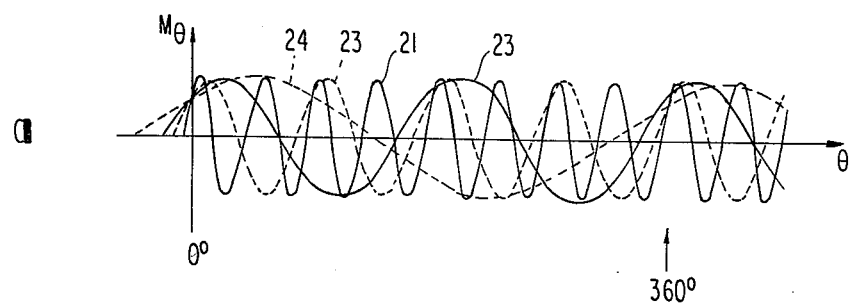
FIGS. 8(*a*) through 8(*h*) show waveforms for use in discussing the fifth embodiment.
Figure 8:
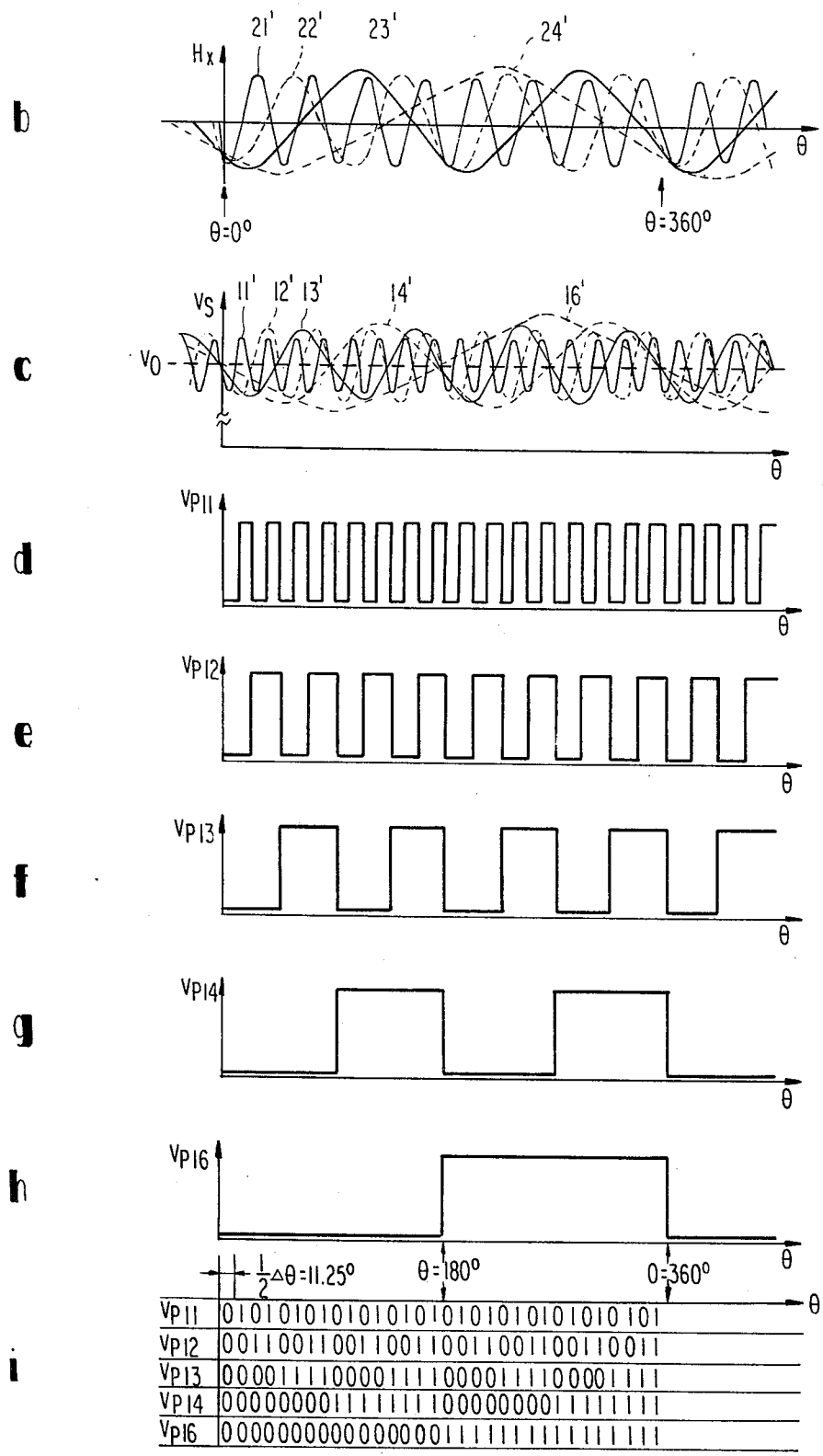

Referring to FIG. 7, a fifth embodiment of this invention is schematically illustrated in perspective. As previously referred to in connection with FIG. 1, the angular distance 360° can be differently addressed by the five tracks 21 to 25. On the other hand, this embodiment can achieve such addressing by only four tracks 21 to 24. To this end, an MR 16 is newly added and aligned in parallel with the MR14.

The functions of the arrangement of FIG. 7 will be discussed in detail by reference to FIGS. 8(a) through 8(i). FIG. 8(a) shows five waveforms indicating the intensities as well as the directions of the magnetic signals recorded on the tracks 21 to 24 as a function of $\theta$. These magnetic signals establish an alternating magnetic field at around the MRs 11 to 14 and 16 as the rotary means 2 revolves. In FIG. 8(b), reference characters 21' to 24' depict curves showing the magnetic field intensities applied to the MRs 11 to 14 in the direction of the x-axis ($H_x$) as a function of $\theta$, respectively. The MRs 11 to 14 are responsive to the $H_x$(21' to 24'), respectively and produce corresponding voltage variations which are shown by curves 11' to 14' in FIG. 8(c), respectively. As to the MR 16, it should be noted that (1) although not shown in FIG. 7, biasing means is provided in the vicinity of the MR 16 in order that the voltage derived from the MR 16 is in phase the same as the $H_x$ applied thereto, and (2) the MR 16 is positioned so as to be spaced apart from the MR 14 by $2\Delta\theta$. Thus, the voltage across the MR 16 changes along a curve 16' as shown in FIG. 8(c), where note that the curve 16' zero-crosses at the angular distances 0°, 180°, 360°, . . . . The voltages 11' to 14' and 16' are then converted, with respect to the threshold $V_0$ (FIG. 8(c)), into pulse trains $V_{p11}$ to $V_{p15}$ and $V_{p16}$, respectively, as shown in FIGS. 8(d) to 8(h). As previously referred to, if the high and low levels of the pulses correspond to logic "1" and "0", respectively, five sequences of bits are obtained as shown in the table of FIG. 8(i). This means that the full 360° are divided into 32 angular sections, each of which is addressed by 5 bits. Consequently, the rotated angular distances of the shaft 1 will be detected in digital form by knowing the addresses.

There will be discussed the biasing means applicable to the MR 16 of FIG. 7.

It has been known in the art that where the sense current Is is set to flow through the MR at the angle of 45° relative to the direction of the magnetization M of the MR, the following advantages can be obtained: (1) the flux sensitivity of the MR increases, and (2) the resistance change of the MR (i.e., the voltage change derived from the MR) is in phase the same as the change of the magnetic field which is applied perpendicular to the sense current Is flowing through the MR.

This biasing method will be explained in more detail by reference FIGS. 9a to 9c, wherein the MR 10 corresponds to the MR 16.

Referring to FIG. 9a, a conductive film 31 is provided on the supporting base 4 on which an insulating film 30 and the MR 10 (width D, length W) are laminated as shown. A current of a predetermined value is applied to the conductive film 31 through terminals 32 from the rotary condition detector 8 (not shown in FIG. 9a). The magnetic field established by this current causes the magnetization M of the MR 10 to be inclined by 45° relative to the sense current Is flowing through the MR 10. Thus, where exposed to the alternating magnetic field, the MR 10 produces the voltage variation which is in phase the same as the change of the magnetic field applied perpendicular to the sense current Is. The voltage thus developed is then derived through the conductive strips 5 and terminals 6.

In FIG. 9b, the conductive film 31 of FIG. 9a is replaced by a hard magnetic film 33. The magnetic field existing about the film 33 causes the direction of the magnetization M to slant by the angle of 45° with respect to that of the sense current Is.

In FIG. 9c, conductive strips 34 cover the MR 10 such that each of their longitudinal axes is at an angle 45° regarding to the easy axis of the MR 10. In the areas between the conductor strips, the sense current Is flows from one strip to the next in a direction normal to the conductor strips 34, thus forming an angle of 45° with the easy axis, while the magnetization M of the MR 10 is not influenced by the strips 34. As a result, the direction of the magnetization M can be inclined by 45° relative to the direction of the sense current Is. The arrangement of FIG. 9c is disclosed in article entitled "The Barber Pole, A Linear Magnetoresistive Head" by K. E. Kuijk et al. published in IEEE Transaction on *Magnetics,* Vol. MAG-11, No. 5, (September 1975) Pages 1215–1217.

In FIGS. 10a and 10b, two magnetic field detecting portions of the detector 4' are schematically illustrated, where two thin films 35 of a high permeable material are provided in each instance for increasing the resolution of the MR. Although this provision of the films 35 is known in the art, it brings about considerable advantages where applied to this invention. In FIG. 10a, the two thin films 35 are positioned on the supporting base 4 in a plane including the MR 10. This arrangement is usable when the surfaces of the MRs and the medium 13 are parallel to each other as shown in FIGS. 1 and 3. Meantime, in FIG. 10b, the thin films 35 are so laminated as to hold the MR 10 therebetween through insulative layers 30, and this arrangement can be applied to this invention where the surfaces of the MRs are perpendicular to that of the medium 3 as shown in FIGS. 4 and 5. In both cases, the thin films 35 should be arranged along with the directions of magnetization of the magnetic signals recorded on the rotary means 2. Inasmuch as these arrangements can permit the resolution of the MRs to increase, the bit-lengths of the tracks of the medium 3 can be reduced in length while maintaining the high resolution or high read out voltages. Hence, the rotary drum or disk 2 can be reduced in diameter without adversely affecting the resolution. Although one of the two films 35 can be omitted, it is practical to employ both. These arrangements can be applied to this invention together with those of FIGS. 9a to 9c.

Figure 11A:
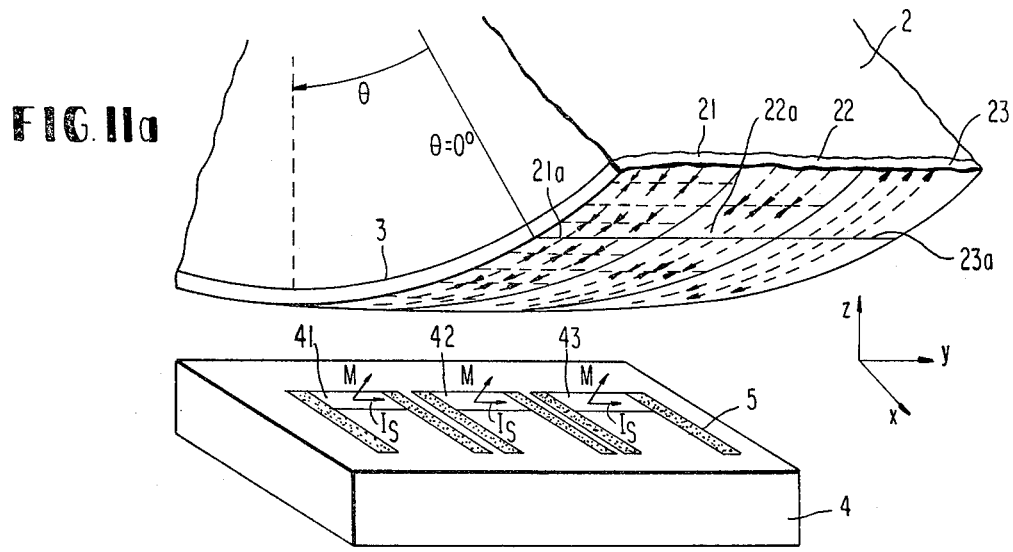
FIG. 11a is an enlarged perspective view of a portion of a sixth embodiment of this invention.
Figure 11B:
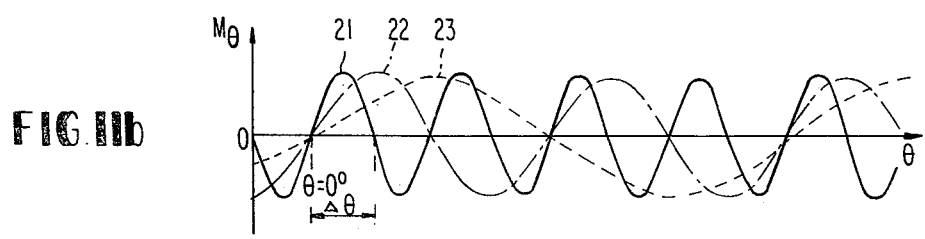

Sixth and seventh embodiments of this invention will be described with reference to FIGS. 11a and 11c, respectively. Although not shown in the drawings for simplicity, one biasing means of FIGS. 9a and 9b, and 9c is applied to MRs 41 to 43 for inclining their magnetizations M by 45° with respect to the corresponding sense currents Is. To meet this application, the boundaries 21a, 22a, and 23a are arranged so as to be on the reference level ($\theta=0$). As a result, the intensities as well as the directions of the magnetic signals recorded on the tracks 21 to 23 change as a function of $\theta$ as shown in FIGS. 11b and 11(d). It follows therefore that, as shown in FIGS. 11(f) to 11(h), the MRs 41 to 43 produce voltages 41' to 43', respectively, each of which zero-crosses at $\theta=0$. These voltages 41' to 43' are then converted, based on the threshold $V_O$, into pulse trains 41'' to 43'' as shown in FIGS. 11(i) to 11(k), respectively, whereby the angular distance corresponding to one period of the pulse train 43'' (i.e., 360°) can be differently addressed by 8-bit-codes as shown in the table of FIG. 11(l). It goes without saying that if more than four tracks are provided, the full 360° can be addressed more precisely. The arrangements of FIGS. 11a and 11c correspond to those of FIGS. 1 and 4. It is apparent that the biasing means can be applied to the embodiments of FIGS. 1 and 3 as well.

Figure 11C:
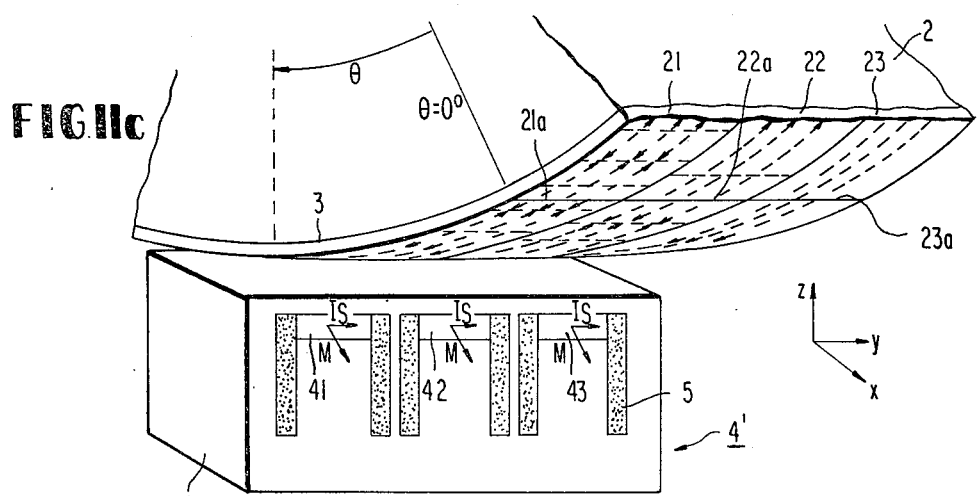
FIG. 11c is an enlarged perspective view of a portion of a modified sixth embodiment.
Figure 11D:
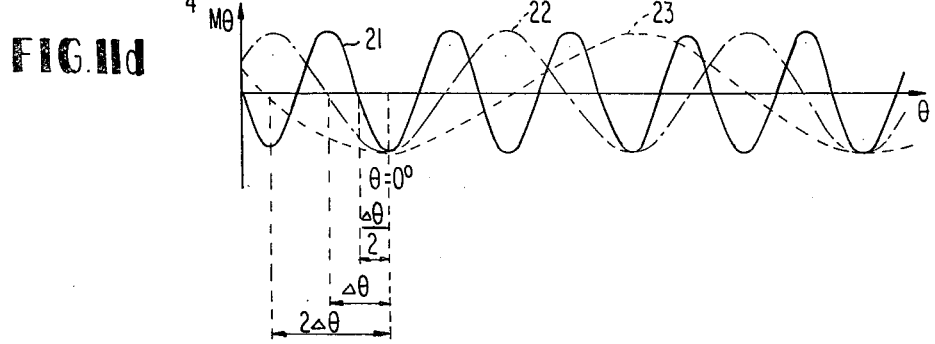

FIG. 11(e) depicts curves showing the magnetic field intensities in a direction of the z-axis, which are applied to the MRs 41 to 43 of FIG. 11c.

Figure 12:
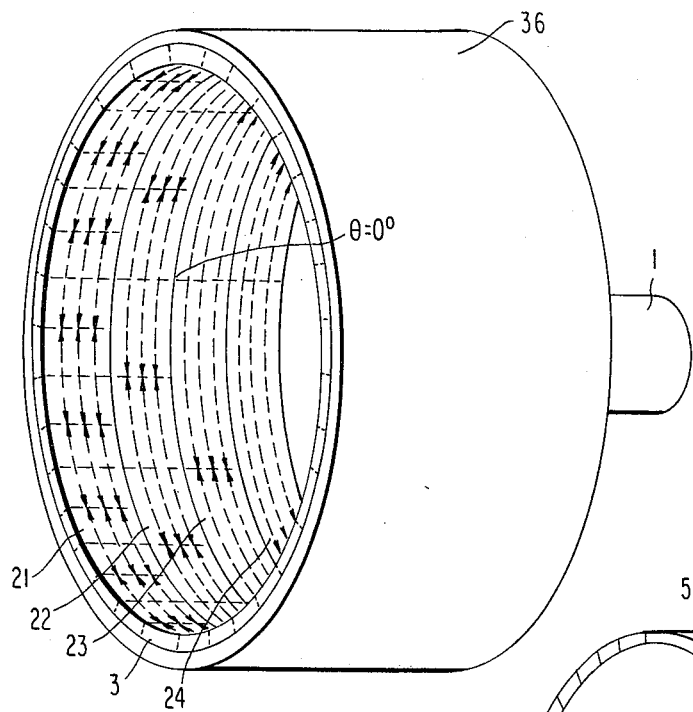
FIG. 12 is a schematic perspective view of a seventh embodiment of this invention.

FIG. 12 schematically illustrates in perspective a modification of the rotary means 2, wherein the medium 3 is provided on the inner surface of a cylinder type rotary means 36. Although not shown, the magnetic field detector 4' should be configured to meet this modified rotary means and should be positioned in the vicinity of the medium 3. This modification is suitable for protecting the medium 3.

FIGS. 13a through 13d schematically illustrate another modifications of the rotary means 2, wherein the magnetic medium 3 is replaced by a plurality of permanent magnets 50 each of which corresponds to one magnetic section.

Figure 13A:
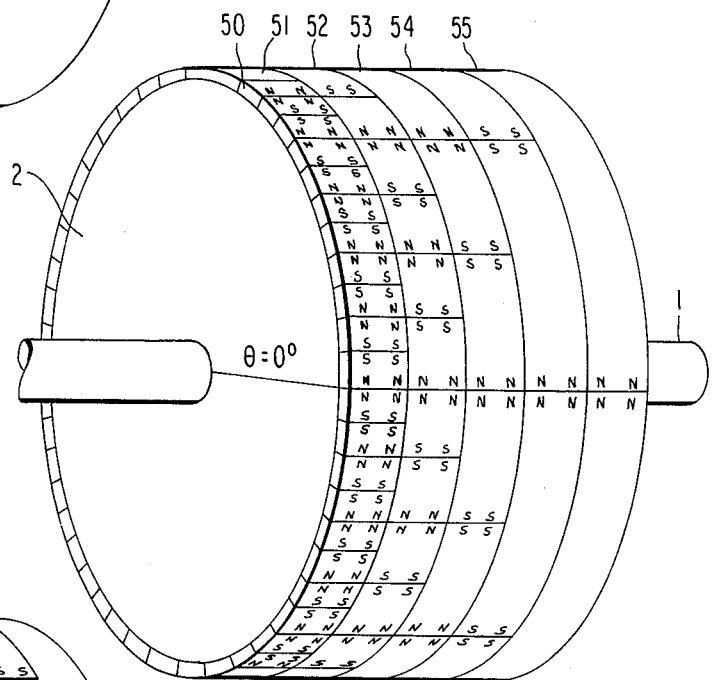
FIG. 13a is a schematic perspective view of a eighth embodiment of this invention.
Figure 13B:
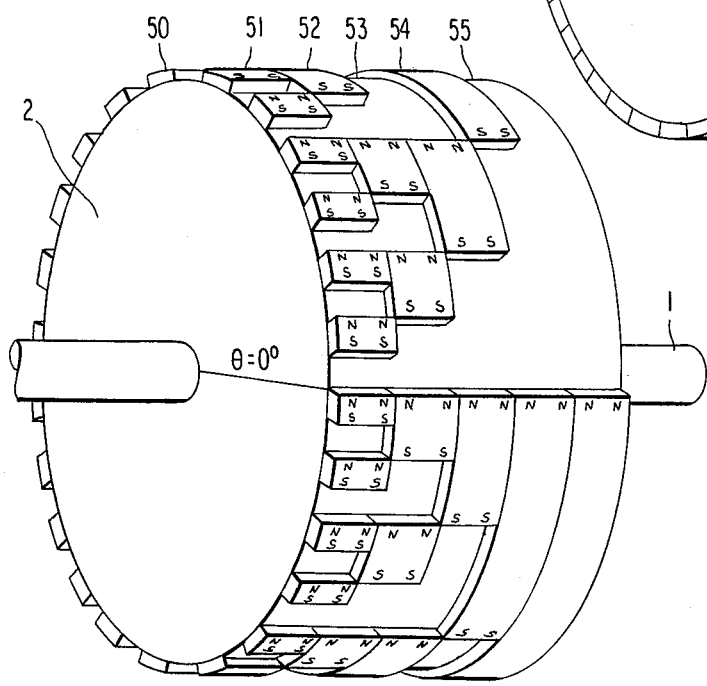

The rotary means of FIGS. 13a and 13c correspond to those of FIGS. 1 and 3, respectively, except that five abutting lines of the magnets align along the reference line ($\theta=0$). These arrangements of FIGS. 13a and 13c are used where the biasing means of FIG. 9 is applied to the MRs. On the other hand, the rotary means of FIGS. 13b and 13d are variations of those of FIGS. 13a and 13c, respectively. As illustrated, the permanent magnets in FIGS. 13b and 13d are spaced on each track from adjacent ones by a distance corresponding to its length.

If such arrangements as in FIGS. 13a to 13d are applied to the embodiments of FIGS. 1, 3, 4, 5, and 7, the magnets 50 should be rearranged so as to produce the same magnetic field as the rotary means of the above embodiments. The permanent magnets 50 are secured on their associated portions by means of a suitable binder.

In the preferred embodiments thus far discussed, all the MRs are mounted on a single base 4, but, alternatively they can be separately provided on more than two bases. Thus, the MRs can be advantageously allowed to be comparatively freely positioned relative to the rotary means 2 under the required conditions such as phase relation between the resultant signals. More specifically, such separated provisions of the MRs give rise to some advantages as referred to below. First, the MRs are no longer needed to be aligned on a single base, so that the overall device becomes flexible in design, in installation, etc. Second, more than two MRs can be provided against one track so as to produce plural signals with the same phase, so that if these signals are added, the signal-to-noise ratio can be increased with a result of the realization of the rotary encoder with high accuracy.

There are two ways for the rotary condition detector 8 to generate pulse trains based on the analog signals supplied from the MRs. In the first place, the analog signals are converted into pulse trains with respect to one threshold $V_o$ as previously referred to in FIGS. 2(c) to 2(e), 6(c) to 6(e), 8(c), and 11(f) to 11(h). The second method is to use two thresholds $V_1$ and $V_2$ as shown in FIG. 14(a), wherein the resultant pulse train $V_p$ shown in FIG. 14(b) has a hysteresis. Our experiment teaches that the second method is found to be useful for noise suppression as well as reliability.

Thus, the rotary condition detector 8 produces only pulse trains for addressing the rotated angular distance of the rotatable shaft 1. However, it can be so designed as to generate an analog signal as shown in FIG. 15, wherein analog signals from MRs 70 to 73 are applied to a digital-to-pulse converter 80 through analog 75 to 78 (each consisting of an analog-to-digital converter with said one threshold $V_o$ or that with said two thresholds $V_1$ and $V_2$, the latter of which is called the Schmit-trigger circuit). The converter 80 then produces its output in analog form. Also, in FIG. 15, reference numerals 81 and 82 indicate output terminals for taking our digital signals and an analog signal therefrom, respectively.

FIG. 16 is a partly broken-away perspective view of the rotary encoder 100 embodying this invention and encased within a housing 60. The rotary means 2 is provided with the magnetic medium 3, and fixedly attached to the shaft 1 by means of suitable fastening means 61. A plurality of MRs, although only one 11 comes into view, are provided on the supporting base 4, and coupled, through the conductive strips 5 and leads 6, to intermediate connecting points 64 on a printed circuit board 63. The intermediate points 64 are coupled to the rotary condition detector 8. A cable 62 is provided for deriving output signals from the magnetic encoder 100 and for applying the sense currents to the plural MRs.

FIG. 17 illustrates one application of the encased magnetic rotary encoder 100 of FIG. 16 to a motor. A motor usually generates a considerably intense magnetic field, and hence the encoder 100 should be protected therefrom. To this end, a plate 65 is provided between the motor 64 and the encoder 100. The plate 65 is preferably made of iron or permalloy for effective protection of the encoder 100. For example, if the plate is made of iron and has a thickness of 0.4 mm (millimeter), a magnetic field strength ranging from about 100 to about 200 Oersted can be reduced to less than 5 Oersted.

Materials of the members employed in the above-mentioned embodiments of this invention will be exemplified hereinafter but not be limited thereto.

The rotary means 2 is preferably fabricated of metal or plastics in view of process accuracy as well as high shock-resistant property. More specifically, in order to reduce the weight of the rotary means 2, aluminum, aluminum alloy, or plastics is suitable for the member of the means 2. If process accuracy must be taken into account, brass is preferred, and if chemical stability is desired, stainless-steel is expedient.

The magnetic medium 3 is practically required to have coercive force exceeding at least 100 Oersted in order to reliably and precisely retain the magnetic signals thereon. For this purpose, the medium 3 is by preference a plated film of Co-P alloy or Co-Ni-P alloy, or being advantageously made by binding magnetic fine particles on the surface of the rotary means 2 with a suitable binder. The magnetic fine particles include ferrite oxide or chronimum oxide as the main ingredient.

These materials are widely used in the magnetic recording field.

Although any of the materials suitable for the magnetic medium 3 is also usable for the permanent magnet 50, a material selected from the followings is more preferable as the magnet 50: barium ferrite having coercive force well over 100 Oersted; plastic magnet including plastic rubber having barium ferrite fine particles bound therein; and a material consisting chiefly of iron, aluminum, nickel, cobalt, or rare earth elements, or cobalt and rare earth elements.

The MRs 10 to 16 and 41 to 43 are preferably made of one of such metals as iron, nickel, and cobalt, or preferably made of an alloy consisting chiefly of at least one of such metals. Among all, an alloy including over 40% nickel or about 5% cobalt has good magneto-resistive characteristics, and hence it is especially desirable.

The conductive films 5, 31, and 34 are usually made of one of such metals as gold, aluminum, and copper, or made of a thinfilm consisting chiefly of at least one of such metals.

Silicon oxide, aluminum oxide, or glass is a suitable material for the insulative thin plate 30. The hard magnetic film 33 is preferably made of one of the same materials as used for the magnetic medium 3. The high permeable magnetic plate 35 is advantageously made of an alloy (for example, permalloy) consisting mainly of iron, nickel, etc. As the base, a silicon single crystal plate or a glass plate having a smooth surface is preferred.

The embodiment of FIG. 7 was actually constructed considering the above, and will be described in detail regarding the materials used, dimentions, etc. The drum type rotary means 2 was made of aluminum alloy, having a diameter of 40 mm and a thickness of 10 mm. A magnetic medium of Co-P alloy was plated on the external surface with a thickness 10 $\mu$(microns), having coercive force of 250 Oersted. By employing a magnetic recording head having a width of 2.5 mm, the magnetic signals were recorded in four tracks on the magnetic medium 3. The magnetic signals have been fully discussed about their directions as well as deviations from $\theta=0$ by reference to FIG. 1 (the rotary means of FIG. 7 is identical to that of FIG. 1), so further description will be omitted. Since the recording head has a width of 2.5 mm, it follows that each track has the same width, viz., 2.5 mm.

Each of the MRs 11 to 14 and 16 is a thin-film mage of Ni-Fe alloy (82% Ni and 18% Fe), and having a width 20 $\mu$, a length of 2 mm, and a thickness of 500 Å (angstrom). The MRs 11 to 14 were provided on a silicon single crystal plate by a vapor deposition technique in a way as to be aligned thereon at an interval of 2.5 mm. The unit shown in FIG. 9a was prepared, wherein the MR 10 corresponds to the MR 16 and the base 4 was another silicon single crystal plate. This unit was positioned such that the MR 16 is spaced apart by a distance of $2\Delta\theta=15.7$ mm from the MR 14. The two silicon single crystal plates were positioned on the printed circuit board 63 (FIG. 17) such that all the MRs were spaced by 2 mm apart from the surface of the medium 3. Further, an integrated circuit serving as the rotary condition detector 8 was provided on the printed circuit board 63. The rotary means 2 was fixedly attached to the shaft 1 by means of the fastening means 61 (FIG. 16), and then encased together with the printed circuit board 63 within the housing, after connected to the cable 62. Thus, the arrangement shown in FIG. 16 was obtained, having features as follows: (1) it has a high resolution of angle 11.25° in contrast to its considerably small size, (2) it is highly reliable in that the pulse generated in the detector 8 has a hysteresis, (3) it can be precisely manufactured and installed in that the rotary means 2 is made of aluminum alloy, and (4) the rotated angular distance of the shaft 1 can be detected in an absolute value.

As is evident from the foregoing, the magnetic rotary encoder according to this invention features: a high resolution of angular distance, reliability, high shock-resistant property, precise manufacturing and installation, and detection of the angular distance in an absolute value.

The reason why this invention employs the MRs as a magnetic sensitive element is that the MRs are very sensitive to applied magnetic fields and able to produce sufficient magnitude of output voltages even when the magnetic field strength is as low as about 30 Oersted. Such sensitivity can not be achieved by conventional elements such as Hall-effect elements or semiconductor magneto-resistive elements. The using of the MRs chiefly contributes the reduction in size without adversely affecting the resolution.

While this invention has been described in terms of specific illustrative embodiments, it is clear to those skilled in the art to which it relates that these embodiments are susceptible of a wide range of modification whithin the spirit and scope of the appended claims.

What is claimed is:

1. A magnetic rotary encoder comprising:
   first means fixedly attachable to a rotatable shaft;
   plural second means respectively retaining magnetic signals and being provided on said first means so as to form more than two tracks, each track having boundaries between said magnetic signals, said tracks being substantially parallel to the circumferential direction of said first means, said tracks producing respectively magnetic fields changing differently in magnitude and direction as said first means revolves;
   plural ferro-magneto-resistors fixedly provided in the vicinity of the rotating paths of said tracks and responsive to said magnetic field and producing analog signals indicative of changes in their electrical resistance, said plural ferro-magneto-resistors within 45° of being parallel to said boundaries; and a rotary condition detector electrically connected to said magneto-resistors receiving said analog signals and producing output signals indicative of the rotated angular distance of said first means in an absolute value.

2. A magnetic rotary encoder as claimed in claim 1, wherein said first means is of a drum-like configuration, and said plural second means are provided on the external surface of said drum-like configuration.

3. A magnetic rotary encoder as claimed in claim 1, wherein said first means is of a disk-like configuration, and said second means are provided on one side surface of said disk-like configuration.

4. A magnetic rotary encoder as claimed in claim 1, wherein said first means is of a cylinder-like configuration, and said second means are provided on the inner surface of said cylinder-like configuration.

5. A magnetic rotary encoder as claimed in claim 1, wherein each of said tracks contain a first boundary nearest to a reference line, and the first boundaries of said tracks are spaced away from said reference line by a distance: $(\Delta\theta/2)\cdot 2^{(m-1)}$ ($m=1, 2, 3, 4, \ldots$) where the maximum number of "m" corresponds to the number of said tracks, and $\Delta\theta/2$ corresponds to the distance between the first boundary of said tracks which is closest to said reference line.

6. A magnetic rotary encoder as claimed in claim 1, wherein each of said tracks contain a boundary on a reference line.

7. A magnetic rotary encoder as claimed in claim 1, wherein said second means each is a magnetic medium.

8. A magnetic rotary encoder as claimed in claim 7, wherein said medium is a ferro-magnetic film with coercive force over 100 Oersted.

9. A magnetic rotary encoder as claimed in claim 8, wherein said ferro-magnetic film is a film made of one of Co-P alloy and Co-Ni-P alloy on a surface of the first means.

10. A magnetic rotary encoder as claimed in claim 1, wherein said second means are permanent magnets provided on said first means at a regular interval in a predetermined direction.

11. A magnetic rotary encoder as claimed in claim 10, wherein said permanent magnets are made of a material containing barium ferrite.

12. A magnetic rotary encoder as claimed in claim 1, wherein said ferromagnetic magneto-resistors are so provided that their surfaces are substantially parallel to the surface of said second means.

13. A magnetic rotary encoder as claimed in claim 1, wherein said ferromagnetic magneto-resistors are so provided that their surfaces are substantially perpendicular to the surface of said second means.

14. A magnetic rotary encoder as claimed in claim 1 or 5, wherein the direction of magnetization of said each ferromagnetic magneto-resistor is parallel to the flowing direction of a sense current in the absence of external magnetic fields.

15. A magnetic rotary encoder as claimed in claim 1 or 6, further comprising biasing means for inclining the direction of magnetization of said each ferromagnetic magneto-resistor by an angle of 45° with respect to the direction of a sense current flowing through said each ferromagnetic magneto-resistor.

16. A magnetic rotary encoder as claimed in claim 1, wherein each of said tracks is associated with one ferromagnetic magneto-resistor.

17. A magnetic rotary encoder as claimed in claim 1, wherein at least one of said tracks is associated with more than one ferromagnetic magneto-resistor, said ferromagnetic magneto-resistor producing outputs having the same phase.

18. A magnetic rotary encoder as claimed in claim 1, further comprising biasing means for inclining the direction of magnetization of said each ferromagnetic magneto-resistor by an angle of 45° with respect to the direction of a sense current flowing through said each ferromagnetic magneto-resistor, and wherein at least one of said tracks is associated with more than one ferromagnetic magneto-resistor and one of said more than one ferromagnetic magneto-resistors is provided with said biasing means.

19. A magnetic rotary encoder as claimed in claim 1, wherein at least one of said ferromagnetic magneto-resistors is provided with at least one high permeable member adjacent at least one side thereof.

20. A magnetic rotary encoder as claimed in claim 1, wherein said plural ferromagnetic magneto-resistors are provided on the same base.

21. A magnetic rotary encoder as claimed in claim 1, wherein said each ferromagnetic magneto-resistor is a thin-film including over about 40% nickel and over about 5% cobalt.

22. A magnetic rotary encoder as claimed in claim 1, wherein said rotary condition detector includes a plurality of analog to digital converters with two thresholds for converting said analog signals into digital signals.

23. A magnetic rotary encoder having an rotary encoder unit and a housing for containing said unit, wherein said encoder unit comprises:
first means fixedly attachable to a rotatable shaft;
plural second means respectively retaining magnetic signals and being provided on said first means so as to form more than two tracks, each track having boundaries between said magnetic signals, said tracks being substantially parallel to the circumferential direction of said first means, said tracks producing respectively magnetic fields changing differently in magnitude and direction as said first means revolves;
plural ferro-magneto-resistors fixedly provided in the vicinity of the rotating paths of said tracks and responsive to said magnetic field and producing analog signals indicative of changes in their electrical resistance, said plural ferro-magneto-resistors within 45° of being parallel to said boundaries;
and a rotary condition detector electrically connected to said magneto-resistors, receiving said analog signals and producing output signals indicative of the rotated angular distance of said first means in an absolute value; and
wherein said housing comprises means for shielding magnetic fields applied externally.

24. A magnetic rotary encoder as claimed in claim 8, wherein said ferro-magnetic film is a film made by binding fine particles including at least one of ferrite and chromium oxide as the main ingredient on a surface of the first means.

25. A magnetic rotary encoder as claimed in claim 10, wherein said permanent magnets are made of a material mainly consisting of at least one of iron, aluminum, nickel, cobalt, rare earth elements, and an alloy consisting chiefly of cobalt and rare earth elements.

26. A magnetic rotary encoder as claimed in claim 10, wherein said permanent magnets are comprised of plastic magnets including plastic rubber having fine particles of barium ferrite bound therein.

* * * * *

UNITED STATES PATENT AND TRADEMARK OFFICE
CERTIFICATE OF CORRECTION

PATENT NO. : 4,274,053

DATED : June 16, 1981

INVENTOR(S) : Susumu ITO et al

It is certified that error appears in the above—identified patent and that said Letters Patent is hereby corrected as shown below:

IN THE SPECIFICATION:

Column 1, line 25, delete "photoslits" insert --photo-slits--;

line 29, after "secondly" insert --,--.

Column 2, line 2, delete "advantage" insert --advantages--;

line 8, delete "abosolute" insert --absolute--;

line 32, delete "signal" insert --signals--;

line 52, delete "comprised".

Column 3, line 19, delete "a eighth" insert --an eighth--;

line 41, delete "on the substantially" insert --on substantially the--.

Column 4, line 44, delete "addressed" insert --addresses--;

line 46, delete "66" insert --$\Delta$--.

Column 5, line 1, after "11" insert --,--;

Column 5, line 24, delete "Figs. 6(b)" insert --Fig. 6(b)--.

UNITED STATES PATENT AND TRADEMARK OFFICE
CERTIFICATE OF CORRECTION

PATENT NO. : 4,274,053

DATED : June 16, 1981

INVENTOR(S) : Susumu ITO et al

It is certified that error appears in the above—identified patent and that said Letters Patent is hereby corrected as shown below:

IN THE SPECIFICATION:

Column 6, line 52, change "Transaction" to --Transactions--

Column 7, line 52, delete "an-";

Column 8, line 21, before "rotary" delete "the" insert --a--;

line 39, delete "a digital-to-pulse converter 80 through analog 75 to 78" and substitute therefor --a digital-to-analog converter 80 through pulse 75 to 78--;

line 40, delete "(each consisting of an analog-to-digital converter with" and substitute therefor --(each consisting of a pulse generator with--;

line 45, change "our" to --out--.

UNITED STATES PATENT AND TRADEMARK OFFICE
CERTIFICATE OF CORRECTION

PATENT NO. : 4,274,053
DATED : June 16, 1981
INVENTOR(S) : Susumu Ito et al

It is certified that error appears in the above—identified patent and that said Letters Patent is hereby corrected as shown below:

IN THE SPECIFICATION:

Column 9, line 44, delete "thinfilm" insert --thin-film--;

line 57, delete "dimentions" insert --dimensions--.

Column 10, line 4, delete "mage" insert --made--;

line 53, change "whithin" to --within--.

UNITED STATES PATENT AND TRADEMARK OFFICE
CERTIFICATE OF CORRECTION

PATENT NO. : 4,274,053

DATED : June 16, 1981

INVENTOR(S) : Susumu Ito et al

It is certified that error appears in the above—identified patent and that said Letters Patent is hereby corrected as shown below:

IN THE CLAIMS:

Column 12, lines 26 and 27, delete "analog to digital converters" and substitute therefor --pulse generators--.

Signed and Sealed this

Twenty-seventh Day of October 1981

[SEAL]

Attest:

GERALD J. MOSSINGHOFF

Attesting Officer      Commissioner of Patents and Trademarks